United States Patent
Jeon

(10) Patent No.: US 8,203,371 B2
(45) Date of Patent: Jun. 19, 2012

(54) SEMICONDUCTOR INTEGRATED CIRCUIT AND METHOD FOR DETERMINING DELAY AMOUNT USING THE SAME

(75) Inventor: Byung Deuk Jeon, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 12/840,258

(22) Filed: Jul. 20, 2010

(65) Prior Publication Data

US 2011/0156790 A1    Jun. 30, 2011

(30) Foreign Application Priority Data

Dec. 29, 2009  (KR) .................. 10-2009-0132765

(51) Int. Cl.
*H03H 11/26* (2006.01)
(52) U.S. Cl. ................ 327/261; 327/263; 327/264
(58) Field of Classification Search .......... 327/261–264
See application file for complete search history.

(56) References Cited

U.S. PATENT DOCUMENTS

| | | | |
|---|---|---|---|
| 5,130,564 A * | 7/1992 | Sin | 327/264 |
| 6,259,294 B1 * | 7/2001 | Murakami et al. | 327/277 |
| 6,564,287 B1 | 5/2003 | Lee | |
| 6,636,446 B2 | 10/2003 | Lee et al. | |
| 7,030,668 B1 * | 4/2006 | Edwards | 327/143 |
| 7,055,012 B2 | 5/2006 | LaBerge et al. | |
| 7,605,668 B2 * | 10/2009 | Fayneh et al. | 331/36 C |
| 7,642,833 B1 * | 1/2010 | Smith et al. | 327/281 |
| 7,733,148 B2 * | 6/2010 | Kim | 327/262 |
| 2005/0105363 A1 | 5/2005 | Ko | |
| 2005/0168259 A1 | 8/2005 | Yamawaki | |
| 2005/0201183 A1 | 9/2005 | Ho | |

FOREIGN PATENT DOCUMENTS

| | | |
|---|---|---|
| JP | 02-159815 | 6/1990 |
| JP | 2003-273712 | 9/2003 |
| JP | 2004-246958 | 9/2004 |
| JP | 2005-038526 | 2/2005 |
| JP | 2005-348296 | 12/2005 |
| KR | 10-2007-0069345 A | 7/2007 |

* cited by examiner

*Primary Examiner* — An Luu
(74) *Attorney, Agent, or Firm* — William Park & Associates Ltd.

(57) ABSTRACT

A semiconductor integrated circuit includes a first node through which an input signal passes and an adjustment block including at least one delay unit electrically connected to the first node. The semiconductor integrated circuit also includes a correction block configured to generate a control signal which controls whether to activate a delay unit.

6 Claims, 9 Drawing Sheets

US 8,203,371 B2

SEMICONDUCTOR INTEGRATED CIRCUIT AND METHOD FOR DETERMINING DELAY AMOUNT USING THE SAME

CROSS-REFERENCES TO RELATED APPLICATION

The present application claims priority under 35 U.S.C. §119(a) to Korean Application No. 10-2009-0132765, filed on Dec. 29, 2009, in the Korean Intellectual Property Office, which is incorporated herein by reference in its entirety as if set forth in full herein.

BACKGROUND

1. Technical Field

The present invention relates to a semiconductor integrated circuit, and more particularly, to a semiconductor integrated circuit that can control a signal delay amount.

2. Related Art

The data transfer rate during data input/output operations of a semiconductor integrated circuit is generally sensitive to variations in environmental and process conditions. This can cause significant design concerns, as well as a number of problems in terms of device performance.

This is due to conflicting parameters in the data transfer rate. Examples of the conflicting parameters include an access time (tAC) and a data retention time (tOH), which are defined in the DRAM or SRAM specification.

The access time (tAC) refers to the amount of time required from the input of a clock to data output, and the data retention time (tOH) refers to the amount of time that data must be retained after the input of a clock.

In order to meet the requirement of the access time (tAC), the data transfer rate must be as high as possible. On the other hand, in order to meet the requirement of the data retention time (tOH), the data transfer rate must be maintained at a low level. Thus, since the two parameters have conflicting characteristics, it is difficult to ensure an appropriate margin.

In addition, when certain process conditions change or certain unintended characteristic variations occur during the process due to process variables, the access time (tAC) and the data retention time (tOH) may be changed out of the specification, resulting in a failure.

Problems with the conventional art can be shown through the timing diagram of FIG. 1. When complying with the process conditions of a characteristic A (General Characteristic), the access time (tAC) is shorter than the access time provided in the specification (tAC spec), and the data retention time (tOH) is longer than the data retention time provided in the specification (tOH spec). Thus, the requirements of the access time (tAC) and the data retention time (tOH) are met.

However, where the operation characteristics of MOS transistors are varied because several process conditions are varied or unintended characteristic variations occur due to process variables, and if the data input/output time has a characteristic B (High-Speed Characteristic), the data retention time (tOH) falls short of the amount of time provided in the specification, resulting in a failure. Furthermore, when the data input/output time has a characteristic C (Low-Speed Characteristic), the access time (tAC) lapses beyond the amount of time provided in the specification, resulting in a failure.

A conventional method for solving these problems associated with variations of environmental conditions and process conditions is described below with reference to FIG. 2. A basic delay amount is set based on basic process condition values, so that the delay amount of data input/output signals may be adjusted. Capacitors MN1, MN2, MP1 and MP2 matched to those values are connected to a circuit. Capacitors MN1 and MP1 are set to a turned-on state, and capacitors MN2 and MP2 are set to a turned-off state. In the event of a change in process conditions or a change in the data transfer rate during the data input/output operation caused by variance in the operation characteristics of the MOS transistors from unintended variations of the process variables, the total delay amount is readjusted by additionally connecting capacitors MN1, MN2, MP1 and MP2 to the circuit by using metal revision by a focus ion beam (FIB).

However, it is difficult to respond accurately to changes in process conditions or changes caused by process variables by using metal revision by FIB, since it may be used only a limited number of times. Furthermore, the metal revision process requires a lot of time and thus compromises the throughput. It also has economic disadvantages due to its high cost.

SUMMARY

In one embodiment of the present invention, a semiconductor integrated circuit includes: a first node through which an input signal is transferred; an adjustment block including at least one delay unit electrically connected to the first node; and a correction block configured to generate a control signal which controls whether the delay units are activated.

In another embodiment of the present invention, a method for determining a delay amount of a semiconductor integrated circuit includes the steps of: detecting a voltage that differs from a source voltage of a sample MOS transistor by a threshold voltage; and determining the delay amount of a delay MOS transistor electrically connected to a node through which an input signal is transferred, depending on the result of the above detection.

BRIEF DESCRIPTION OF THE DRAWINGS

Features, aspects, and embodiments are described in conjunction with the attached drawings, in which.

DETAILED DESCRIPTION

A semiconductor integrated circuit and a method for determining a delay amount using the same, according to the present invention, is described below with reference to the accompanying drawings through preferred embodiments.

Figure 1:
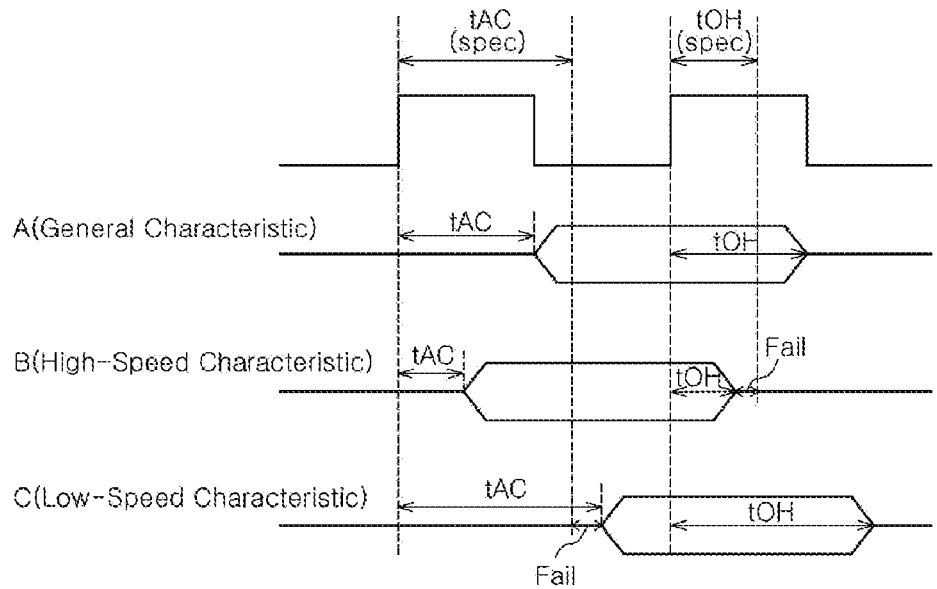
FIG. 1 is a timing diagram of an access time (tAC) and a data retention time (tOH)
Figure 2:
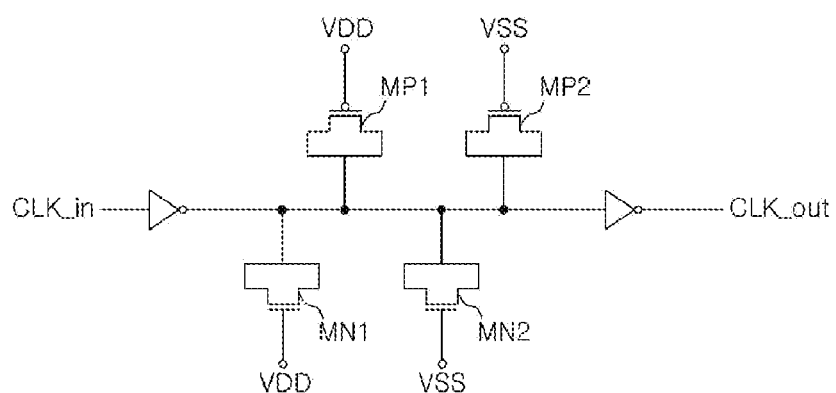
FIG. 2 illustrates a conventional semiconductor integrated circuit.
Figure 3:
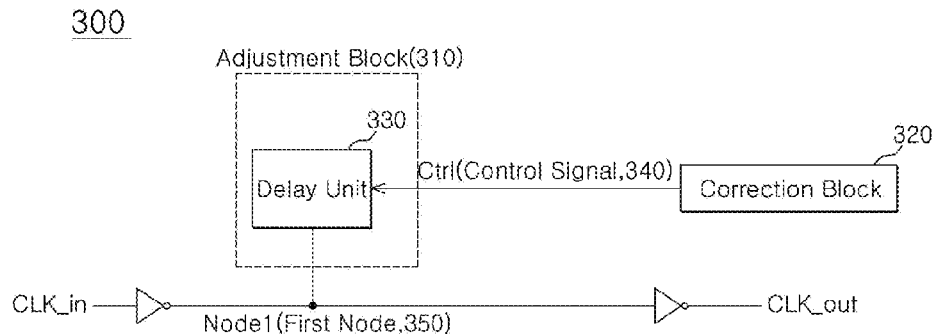
FIG. 3 illustrates a semiconductor integrated circuit according to one embodiment.

FIG. 3 illustrates a semiconductor integrated circuit 300 according to one embodiment.

Referring to FIG. 3, the semiconductor integrated circuit 300 may include a first node 350, through which a signal is transferred from a clock input terminal CLK_in to a clock output terminal CLK_out, an adjustment block 310 and a correction block 320. The adjustment block 310 includes a delay unit 330 electrically connected to the first node 350. The correction block 320 is configured to generate a control signal 340 which controls whether to activate the delay unit 330.

The correction block 320 is configured to automatically detect a change from the initially designed signal transfer rate to the actual signal transfer rate that is caused when some process conditions are varied or unintended property variations arise due to process variables in the semiconductor integrated circuit, and to generate a control signal 340 for correcting that change in the signal transfer rate. The control signal 340 may be directly inputted to the delay unit 330, and may be inputted to the delay unit 330 through another electric component (not shown) provided in the adjustment block 310.

The delay unit 330 is activated or deactivated in response to the control signal 340. When the delay unit 330 is activated, the signal transfer rate of the first node 350 is lowered. When the delay unit 330 is deactivated, it has no influence on the signal transfer rate of the first node 350. As an example, when the actual signal transfer rate is faster than the initially designed signal transfer rate, the signal transfer rate may be reduced by activating the delay unit 330.

Figure 4:
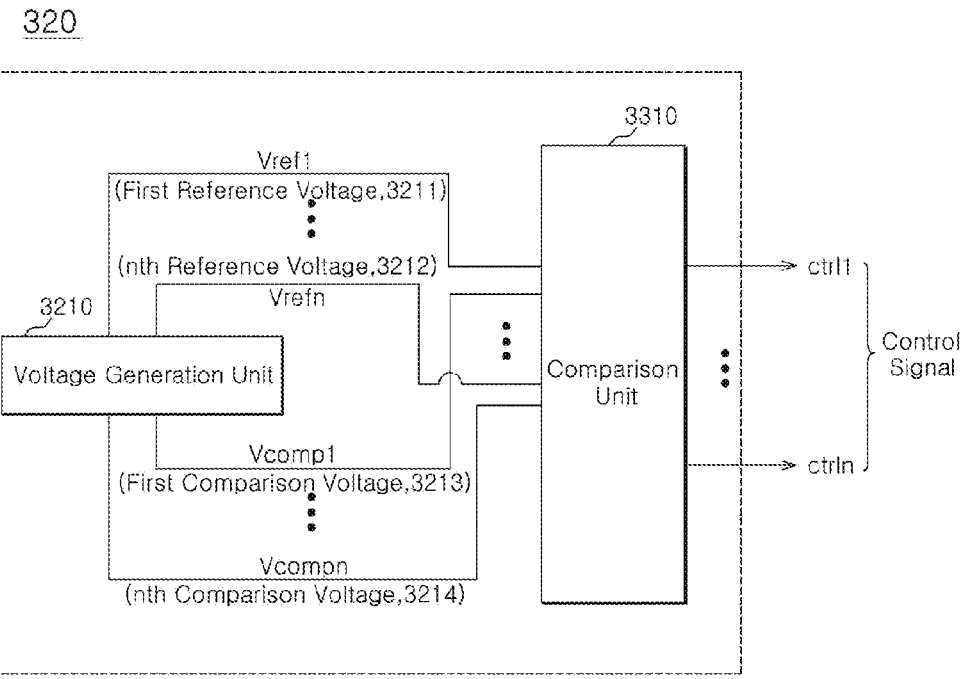
FIG. 4 is a detailed block diagram of a correction block illustrated in FIG. 3.

FIG. 4 is a block diagram illustrating the configuration of the correction block 320.

The correction block 320 may include a voltage generation unit 3210 configured to generate first to nth reference voltages 3211, ..., 3212 and first to nth comparison voltages 3213, ..., 3214, and a comparison unit 3310 configured to compare the reference voltage with the comparison voltage and to output the control signal 340.

The voltage generation unit 3210 may generate a single reference voltage and a single comparison voltage, or may generate a plurality of reference voltages and a plurality of comparison voltages. A plurality of comparison circuits may be provided inside the comparison unit 3310. Each of the comparison circuits may be configured to receive and compare the reference voltage and the comparison voltage and to generate the control signal 340.

Figure 5:
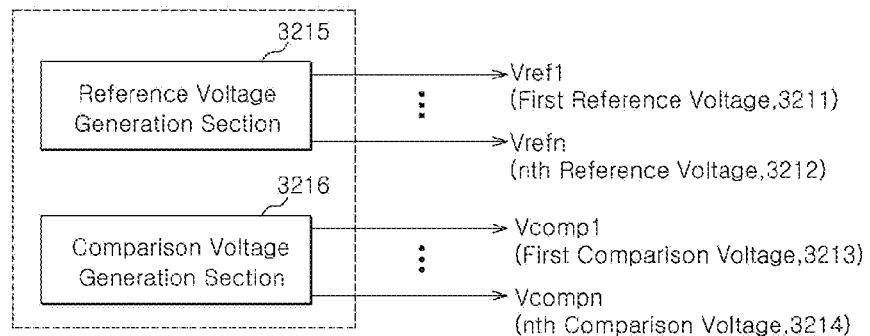
FIG. 5 is a detailed block diagram of a voltage generation unit illustrated in FIG. 4.

FIG. 5 is a block diagram illustrating the configuration of the voltage generation unit 3210.

The voltage generation unit 3210 may include a reference voltage generation section 3215 configured to generate first through nth reference voltages 3211, ..., 3212, and a comparison voltage generation section 3216 configured to generate first through Nth comparison voltages 3213, ..., 3214. The reference voltage generation section 3215 may generate a single reference voltage, or may generate a plurality of reference voltages. The comparison voltage generation section 3216 may generate a single comparison voltage, or may generate a plurality of comparison voltages.

Figure 6A:
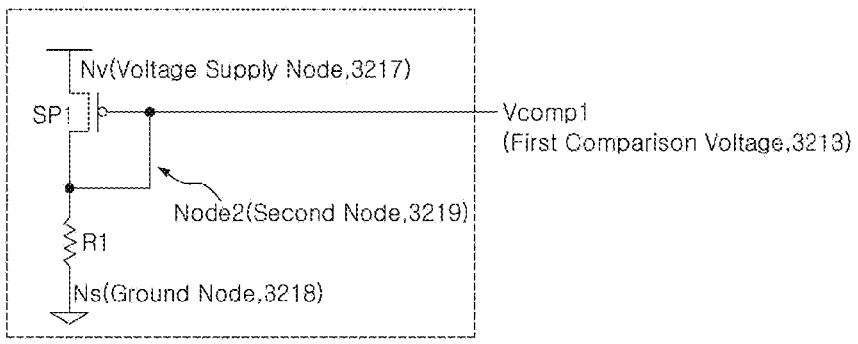
FIGS. 6A and 6B are detailed circuit diagrams of a comparison voltage generation section illustrated in FIG. 5.
Figure 6B:
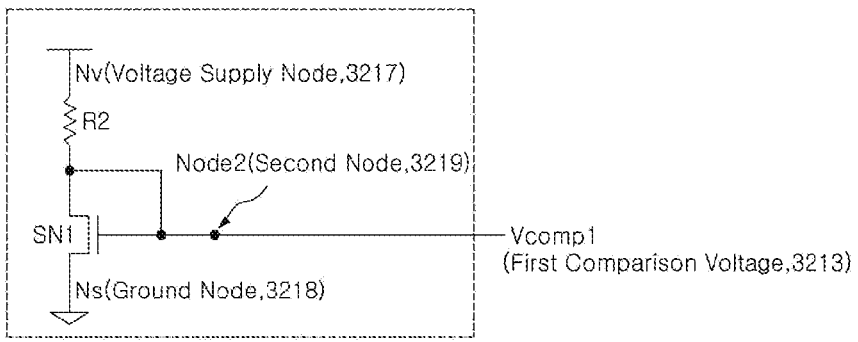

FIGS. 6A and 6B are detailed circuit diagrams of the comparison voltage generation section 3216.

FIG. 6A illustrates a comparison voltage generation section 3216 configured to detect a voltage that is lower than a predetermined power supply voltage by an amount equal to a threshold voltage. A ground node 3218 is connected to a second node 3219 through a resistor R1, and the voltage of the second node 3219 is lowered by the ground node 3218. When the voltage of the second node 3219 is lowered and reaches the threshold voltage of a PMOS transistor SP1, the PMOS transistor SP1 is turned on. When the PMOS transistor SP1 is turned on, a predetermined power supply voltage is applied through a voltage supply node 3217 to the second node 3219, and the voltage of the second node 3219 is increased. When the voltage of the second node 3219 is increased and reaches the threshold voltage of the PMOS transistor SP1, the PMOS transistor SP1 is turned off. Through this procedure, the voltage of the second node 3219 is adjusted to a voltage difference between the gate and the source of the PMOS transistor SP1, or, in other words, a voltage which is lowered by the threshold voltage of the PMOS transistor SP1 from the predetermined power supply voltage supplied through the voltage supply node 3217. The PMOS transistor SP1 may adjust the threshold voltage by adjusting some process conditions, and may have various threshold voltages when unintended property variations occur during the process due to process variables.

FIG. 6B illustrates the comparison voltage generation section 3216 configured to detect a threshold voltage of an NMOS transistor SN1. A voltage supply node 3217 is connected to a second node 3219 through a resistor R2. A predetermined power supply voltage is supplied through the voltage supply node 3217, and thus the voltage of the second node 3219 is increased. When the voltage of the second node 3219 is increased and reaches a threshold voltage of an NMOS transistor SN1, the NMOS transistor SN1 is turned on. When the NMOS transistor SN1 is turned on, a ground node 3218 and the second node 3219 are electrically connected together and thus the voltage of the second node 3219 is lowered. When the voltage of the second node 3219 is lowered and reaches the threshold voltage of the NMOS transistor SN1, the NMOS transistor SN1 is turned off. Through this procedure, the voltage of the second node 3219 is adjusted to a voltage difference between the gate and the source of the NMOS transistor SN1, or, in other words, a voltage which is higher than the voltage of the ground node 3218 by an amount equal to the threshold voltage of the NMOS transistor SN1. The NMOS transistor SN1 may adjust the threshold voltage by varying some process conditions, and may have various threshold voltages when unintended property variations occur during the process due to process variables.

Figure 7A:
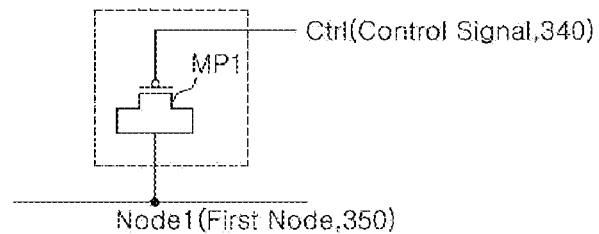
FIGS. 7A through 7C are detailed circuit diagrams of first implementation examples of a delay unit illustrated in FIG. 3.
Figure 7B:
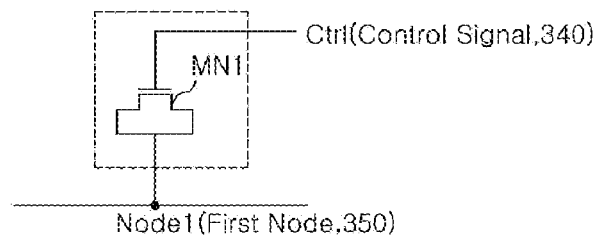
Figure 7C:
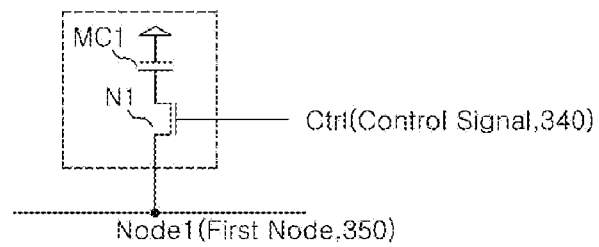

FIGS. 7A through 7C illustrate the first embodiment of the delay unit 330.

The delay unit 330 may include a PMOS transistor MP1, an NMOS transistor MN1, and a capacitor MC1. The delay unit 330 may be activated or deactivated by the logic level of the control signal 340 and may adjust the signal transfer rate of the first node 350, which is electrically connected to the delay unit 330.

In the first embodiment of the delay unit 330, the PMOS transistor MP1 and the NMOS transistor MN1 operate as capacitors and are activated when the logic level of the control signal 340 reaches the threshold voltage. Since the sources and drains of the PMOS transistor MP1 and the NMOS transistor MN1 are electrically connected to the first node 350, the PMOS transistor MP1 and the NMOS transistor MN1 operate as capacitors when the control signal 340 inputted to the gates thereof activate the PMOS transistor MP1 and the NMOS transistor MN1. When the PMOS transistor MP1 and the NMOS transistor MN1 operate as capacitors, the signal transfer rate of the first node 350 is reduced. When the PMOS transistor MP1 or the NMOS transistor MN1 is deactivated, it does not operate as a capacitor and thus has no influence on the signal transfer rate of the first node 350. By controlling the PMOS transistor MP1, changes in the signal transfer rate caused by variations in the properties of PMOS transistor MP1 may be resolved. By controlling the NMOS transistor MN1, changes in the signal transfer rate caused by variations in the properties of NMOS transistor MN1 may be resolved.

In the first embodiment of the delay unit 330, the capacitor MC1 may include a capacitor C1 and an enable transistor N1. The enable transistor N1 is activated or deactivated by the control signal 340. When the enable transistor N1 is activated, the capacitor MC1 operates as a capacitor electrically connected to the first node 350, and reduces the signal transfer rate of the first node 350. On the other hand, when the enable transistor N1 is deactivated, the capacitor MC1 is electrically separated from the first node 350 and has no influence on the signal transfer rate of the first node 350.

Figure 8:
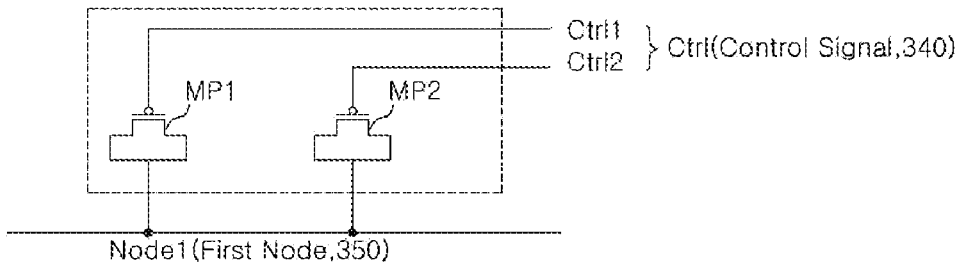
FIG. 8 is a detailed circuit diagram of a second implementation example of a delay unit illustrated in FIG. 3.

FIG. 8 illustrates a second embodiment of the delay unit 330.

The delay unit 330 may include PMOS transistors MP1 and MP2.

The sources and drains of the PMOS transistors MP1 and MP2 are electrically connected to the first node 350, and are turned on/off by the control signals 340 inputted to the gates thereof.

The PMOS transistors MP1 and MP2 may be activated or deactivated by the logic levels of control signals 340 and adjust the signal transfer rate of the first node 350, which is electrically connected to the delay unit 330. When PMOS transistor MP1 or MP2 is activated, it operates as a capacitor and reduces the signal transfer rate of the first node 350. On the other hand, when the PMOS transistor MP1 or MP2 is deactivated, it does not operate as a capacitor and thus has no influence on the signal transfer rate of the first node 350. In this case, the control signals inputted to the PMOS transistors MP1 and MP2 are two independently applied signals.

In the second embodiment of the delay unit 330, when the signal transfer rate is at the originally intended level, the first control signal 340 inputted to the PMOS transistor MP1 may be configured to activate the PMOS transistor MP1, and the second control signal 340 inputted to the PMOS transistor MP2 may be configured to deactivate the PMOS transistor MP2.

When the signal transfer rate increases due to changes in some process conditions or in operation characteristics of the PMOS transistor from unintended variations in properties caused during the process by process variables, the second control signal 340 inputted to the PMOS transistor MP2 activates the PMOS transistor MP2. Also, the number of capacitors electrically connected to the first node 350 increases, thereby reducing the signal transfer rate. On the other hand, when the signal transfer rate decreases due to changes in some process conditions or in operation characteristics of the PMOS transistor from unintended variations in properties caused during the process by process variables, the first control signal 340 inputted to the PMOS transistor MP1 deactivates the PMOS transistor MP1. Also, the number of capacitors electrically connected to the first node 350 decreases, thereby increasing the signal transfer rate. By controlling the PMOS transistors MP1 and MP2, changes in the signal transfer rate caused by variations in the properties of the PMOS transistors may be resolved.

In the above-described second embodiment of the delay unit 330, the signal transfer rate can be precisely controlled in each step with three or more PMOS transistors. Also, in the above-described second embodiment of the delay unit 340, variations in the signal transfer rate caused by property variations of the NMOS transistors may be resolved by providing the NMOS transistors.

Figure 9:
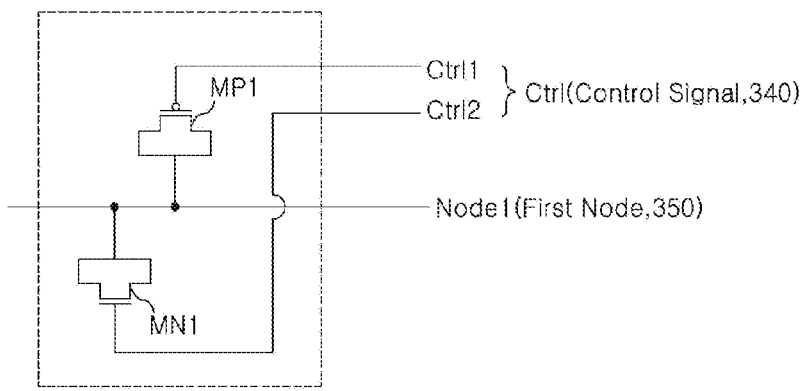
FIG. 9 is a detailed circuit diagram of a third implementation example of a delay unit illustrated in FIG. 3.

FIG. 9 illustrates a third embodiment of the delay unit 330.

The delay unit 330 may include a PMOS transistor MP1 and an NMOS transistor MN1.

The sources and drains of the PMOS transistor MP1 and the NMOS transistor MN1 are electrically connected to the first node 350, and are turned on/off by the control signal 340 inputted to the gates thereof.

The PMOS transistor MP1 and the NMOS transistor MN1 may be activated or deactivated by the logic level of the control signal 340 and may adjust the signal transfer rate of the first node 350, which is electrically connected to the delay unit 330. When PMOS transistor MP1 or NMOS transistor MN1 is activated, it operates as a capacitor and reduces the signal transfer rate of the first node 350. On the other hand, when PMOS transistor MP1 or NMOS transistor MN1 is deactivated, it does not operate as a capacitor and thus has no influence on the signal transfer rate of the first node 350.

In the third embodiment of the delay unit 330, when the signal transfer rate is at the originally intended level, the first control signal 340 inputted to the PMOS transistor MP1 may be configured to activate the PMOS transistor MP1, and the second control signal 340 inputted to the NMOS transistor MN1 may be configured to deactivate the NMOS transistor MN1.

When the signal transfer rate increases due to changes in some process conditions or in operation characteristics of the PMOS transistor from unintended property variations caused during the operation by process variables, the first control signal 340 inputted to the PMOS transistor MP1 activates the PMOS transistor MP1. Also, the number of capacitors electrically connected to the first node 350 increases, thereby reducing the signal transfer rate. On the other hand, when the signal transfer rate decreases due to changes in some process conditions or in operation characteristics of the NMOS transistor from unintended property variations caused during the operation by process variables, the second control signal 340 inputted to the NMOS transistor MN1 deactivates the PMOS transistor MN1. Also, the number of capacitors electrically connected to the first node 350 decreases, thereby increasing the signal transfer rate. By controlling PMOS transistor MP1 and NMOS transistor MN1, variations in the signal transfer rate caused by property variations of the PMOS transistor or the NMOS transistor may be resolved.

Figure 10:
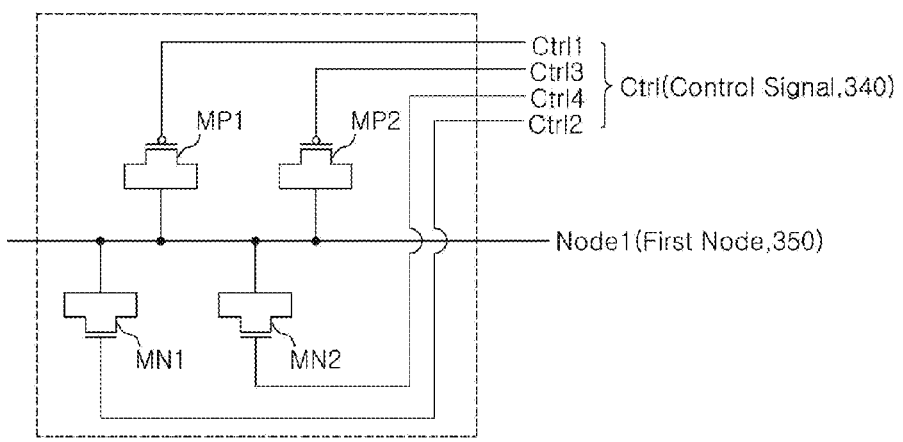
FIG. 10 is a detailed circuit diagram of a fourth implementation example of a delay unit illustrated in FIG. 3.

FIG. 10 illustrates a fourth embodiment of the delay unit 330.

The delay unit 330 may include PMOS transistors MP1 and MP2 and NMOS transistors MN1 and MN2.

The sources and drains of the PMOS transistors MP1 and MP2 and the NMOS transistors MN1 and MN2 are electrically connected to the first node 350, and are turned on/off by the control signals 340 inputted to the gates thereof. In this case, the control signals inputted to the PMOS transistors MP1 and MP2 and the NMOS transistors MN1 and MN2 may be four independently applied signals.

The PMOS transistors MP1 and MP2 and the NMOS transistors MN1 and MN2 may be activated or deactivated by the logic levels of the control signals 340 and may adjust the signal transfer rate of the first node 350, which is electrically connected to the delay unit 330. When the PMOS transistor MP1 or MP2 or the NMOS transistor MN1 or MN2 is activated, it operates as a capacitor and reduces the signal transfer rate of the first node 350. On the other hand, when the PMOS transistor MP1 or MP2 or the NMOS transistor MN1 or MN2 is deactivated, it does not operate as a capacitor and thus has no influence on the signal transfer rate of the first node 350.

In the fourth embodiment of the delay unit 330, when the signal transfer rate is at the originally intended level, the first control signal and the second control signal inputted to the PMOS transistor MP1 and the NMOS transistor MN1 may be configured to activate the PMOS transistor MP1 and the NMOS transistor MN1, and the third control signal and the fourth control signal inputted to the PMOS transistor MP2 and the NMOS transistor MN2 may be configured to deactivate the PMOS transistor MP2 and the NMOS transistor MN2.

When the signal transfer rate increases due to changes in some process conditions or in operation characteristics of the PMOS transistor from unintended property variations caused during the operation by process parameters, the third control signal 340 inputted to the PMOS transistor MP2 activates the PMOS transistor MP2. Also, the number of capacitors electrically connected to the first node 350 increases, thereby reducing the signal transfer rate. On the other hand, when the signal transfer rate decreases due to changes in some process conditions or in operation characteristics of the PMOS transistor from unintended property variations caused during the operation by process parameters, the first control signal 340 inputted to the PMOS transistor MP1 deactivates the PMOS transistor MP1. Also, the number of capacitors electrically connected to the first node 350 decreases, thereby increasing the signal transfer rate.

When the signal transfer rate increases due to changes in some process conditions or in operation characteristics of the PMOS transistor from unintended property variations caused during the operation by process parameters, the fourth control signal 340 inputted to the NMOS transistor MN2 activates the NMOS transistor MN2. Also, the number of capacitors electrically connected to the first node 350 increases, thereby reducing the signal transfer rate. On the other hand, when the signal transfer rate decreases due to changes in some process conditions or in operation characteristics of the PMOS transistor from unintended property variations caused during the operation by process parameters, the second control signal 340 inputted to the NMOS transistor MN1 deactivates the NMOS transistor MN1. Also, the number of capacitors electrically connected to the first node 350 decreases, thereby increasing the signal transfer rate.

As described above, by controlling the PMOS transistors MP1 and MP2 the NMOS transistors MN1 and MN2, variations in the signal transfer rate caused by property variations of the PMOS transistors and the NMOS transistors may be resolved.

In the above-described fourth embodiment of the delay unit 330, the signal transfer rate can be precisely controlled in each step with three or more PMOS transistors and NMOS transistors.

Figure 11:
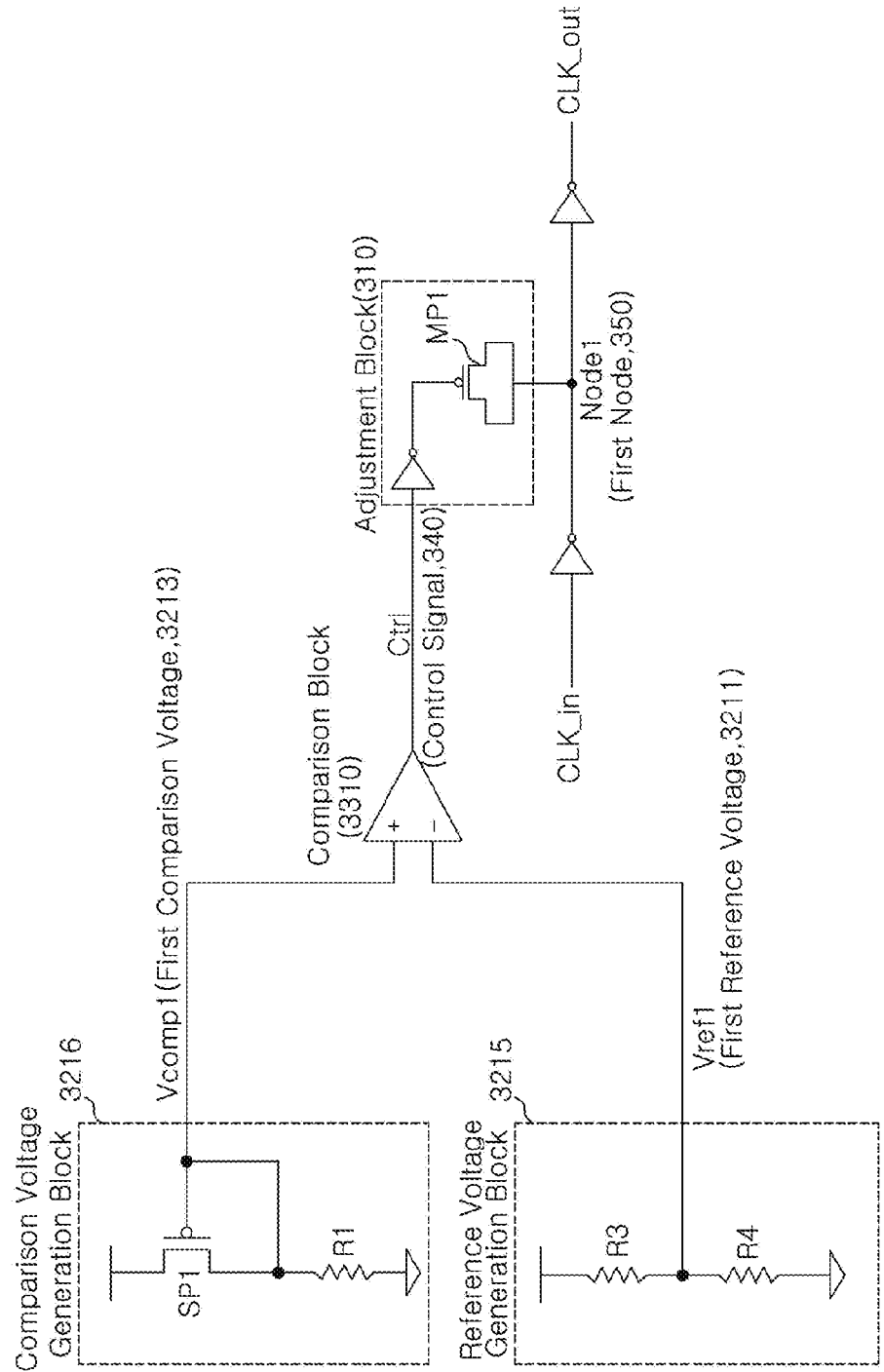
FIG. 11 is a circuit diagram of a semiconductor integrated circuit according to one embodiment.

FIG. 11 is a circuit diagram of a semiconductor integrated circuit according to one embodiment.

The semiconductor integrated circuit may include an adjustment block 310, a comparison block 3310, a comparison voltage generation block 3216, and a reference voltage generation block 3215. The adjustment block 310 includes a first node 350 through which a signal is transferred from a clock input terminal CLK_IN to a clock output terminal CLK_OUT, and a PMOS transistor MP1 electrically connected to the first node 350. The comparison block 3310 is configured to compare a first comparison voltage 3213 with a first reference voltage 3211, to amplify a comparison result signal, and to apply an amplified comparison result signal to the PMOS transistor MP1. The comparison voltage generation block 3216 is configured to generate the first comparison voltage 3213. The reference voltage generation block 3215 is configured to generate the first reference voltage 3211.

The comparison voltage generation block 3216 generates a voltage that is lower than a predetermined power supply voltage by an amount equal to the threshold voltage of a PMOS transistor SP1, and applies the voltage to the comparison block 3310 as the first comparison voltage 3213. The reference voltage generation block 3215 generates the first reference voltage 3211 by using a resistance ratio of a resistor R3 to a resistor R4, and applies the first reference voltage 3211 to the comparison block 3310.

The comparison block 3310 may include a differential amplifier, which compares the first reference voltage 3211 with the first comparison voltage 3213, and generates the control signal 340. The PMOS transistor MP1 of the adjustment block 310 is activated or deactivated in response to the control signal 340. When the PMOS transistor MP1 is activated, it operates as a capacitor and lowers the signal transfer rate of the first node 350. When the PMOS transistor MP1 is deactivated, it does not operate as a capacitor and thus has no influence on the signal transfer rate of the first node 350.

As described above, by controlling the PMOS transistor MP1, variations in the signal transfer rate caused by property variations of the PMOS transistor MP1 may be resolved. Meanwhile, by using the comparison voltage generation section 3216 having the NMOS transistor (see FIG. 6B) instead of the comparison voltage generation block 3216 of FIG. 11 and by using the NMOS transistor MN1 instead of the PMOS transistor MP1 of the adjustment block 310, it is possible to cope with variations in the signal transfer rate caused by property variations of the NMOS transistor.

Figure 12:
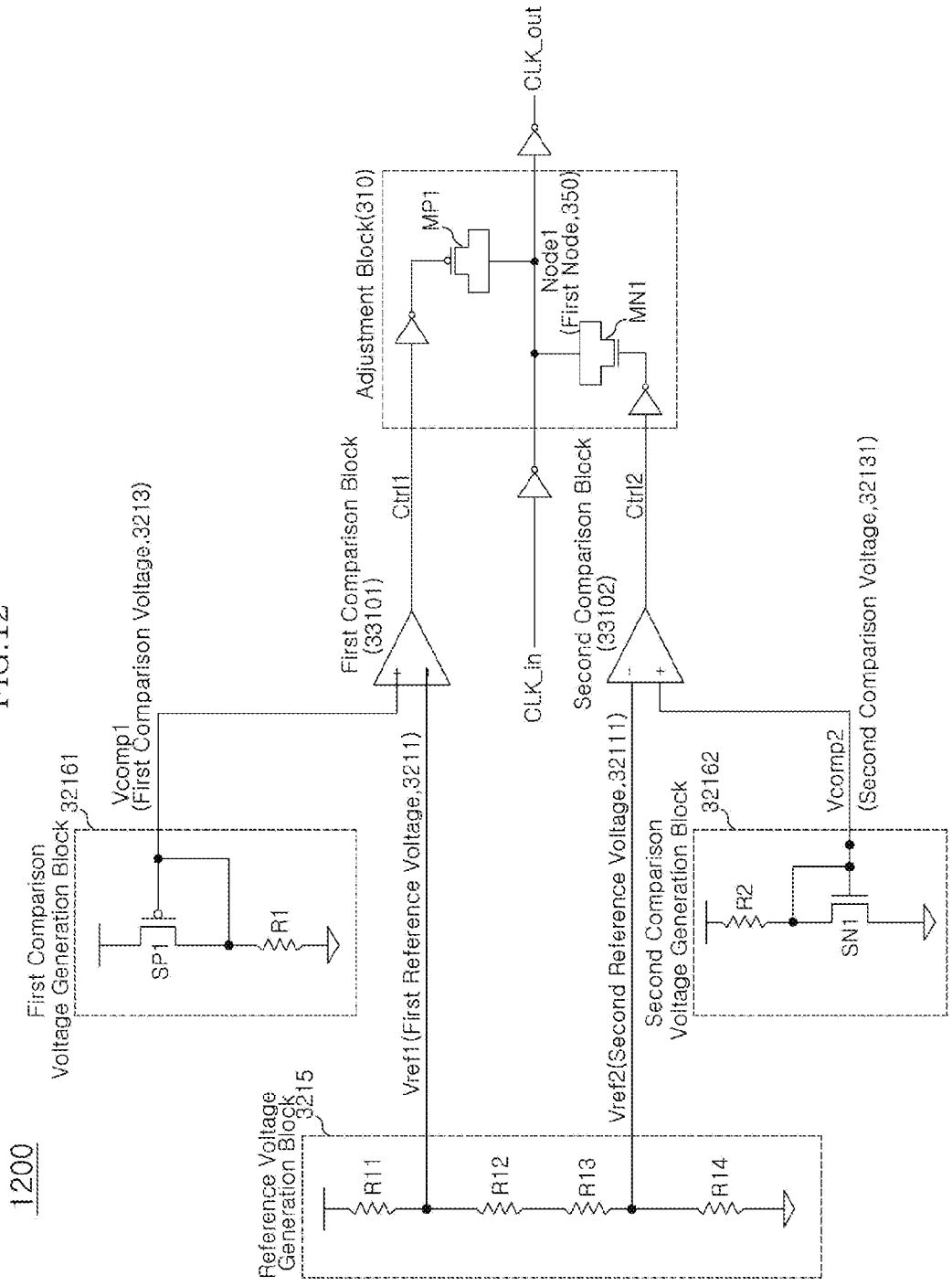
FIG. 12 is a circuit diagram of a semiconductor integrated circuit according to another embodiment.

FIG. 12 is a circuit diagram of a semiconductor integrated circuit according to another embodiment.

The semiconductor integrated circuit may include an adjustment block 310, a first comparison block 33101, a second comparison block 33102, a first comparison voltage generation block 32161, a second comparison voltage generation block 32162, and a reference voltage generation block 3215. The adjustment block 310 includes a first node 350 through which a signal is transferred from a clock input terminal CLK_IN to a clock output terminal CLK_OUT, and a PMOS transistor MP1 and an NMOS transistor MN1 electrically connected to the first node 350. The first comparison block 33101 is configured to compare a first comparison voltage 3213 with a first reference voltage 3211, to amplify a comparison result signal, and to apply an amplified comparison result signal to the PMOS transistor MP1. The second comparison block 33102 is configured to compare a second comparison voltage 32131 with a second reference voltage 32111, to amplify a comparison result signal, and to apply an amplified comparison result signal to the NMOS transistor MN1. The first comparison voltage generation block 32161 is configured to generate the first comparison voltage 3213. The second comparison voltage generation block 32162 is configured to generate the second comparison voltage 32131. The reference voltage generation block 3215 is configured to generate the first reference voltage 3211 and the second reference voltage 32111.

The first comparison voltage generation block 32161 generates a voltage that is lower than a predetermined power supply voltage by an amount equal to the threshold voltage of a PMOS transistor SP1, and applies the voltage to the first comparison block 33101 as the first comparison voltage 3213. The reference voltage generation block 3215 generates the first reference voltage 3211 by using a resistance ratio of a resistor R11 to the resistors R12, R13 and R14, and applies the first reference voltage 3211 to the first comparison block 33101.

The second comparison voltage generation block 32162 generates a threshold voltage of an NMOS transistor SN1, and applies the threshold voltage to the second comparison block 33102 as the second comparison voltage 32131. The reference voltage generation block 3215 generates the second reference voltage 32111 by using a resistance ratio of the resistors R11, R12 and R13 to the resistor R14, and applies the second reference voltage 32111 to the second comparison block 33102.

The first comparison block 33101 may include a differential amplifier which compares the first reference voltage 3211 with the first comparison voltage 3213 and generates the first control signal 340. The second comparison block 33102 may include a differential amplifier which compares the second reference voltage 32111 with the second comparison voltage 32131 and generates the second control signal 340. The PMOS transistor MP1 and the NMOS transistor MN1 of the adjustment block 310 are activated or deactivated in response to the first and second control signals 340, respectively. When the PMOS transistor MP1 or the NMOS transistor MN1 is activated, it operates as a capacitor and reduces the signal transfer rate of the first node 350. When the PMOS transistor MP1 or the NMOS transistor MN1 is deactivated, it does not operate as a capacitor and thus has no influence on the signal transfer rate of the first node 350.

As described above, by controlling the PMOS transistor MP1 and the NMOS transistor MN1, variations in the signal transfer rate caused by property variations of the PMOS transistor and the NMOS transistor may be resolved. Meanwhile, by adding capacitors that are electrically connected to the first node 350 and operate as capacitors in the above-described manner, it is possible to precisely control the signal transfer rate in each step.

Figure 13:
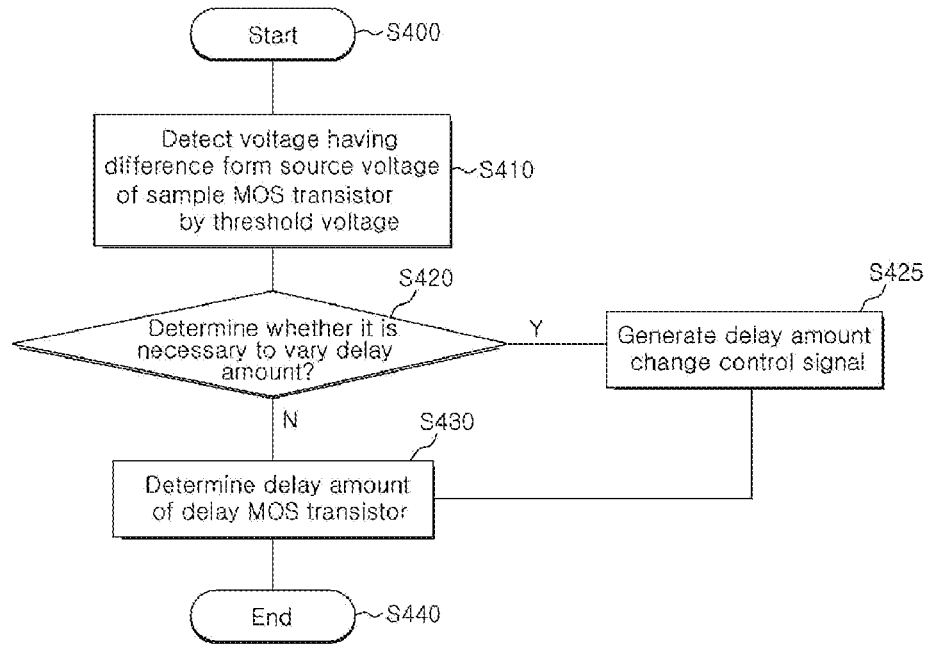
FIG. 13 is an operation flowchart according to one embodiment or another embodiment.

FIG. 13 is an operation flowchart according to one embodiment or another embodiment.

The operation flowchart may include the steps of: detecting a voltage that differs from a source voltage of a sample MOS transistor by an amount equal to a threshold voltage (S410); determining whether it is necessary to vary a delay amount (S420); generating a delay amount change control signal (S425); and determining a delay amount of a delay MOS transistor (S430).

The sample MOS transistor is transistor SP1 or SN1 of the comparison voltage generation block in one embodiment or another embodiment. When the sample MOS transistor is a PMOS transistor, it may generate a voltage that is lower than a certain power supply voltage by an amount equal to a threshold voltage. When the sample MOS transistor is a NMOS transistor, it may generate a voltage that is higher than a ground voltage by an amount equal to a threshold voltage.

A determination is made as to whether it is necessary to vary the delay amount of the detected signal (S420). If it is necessary, the delay amount change control signal is generated (S425). If not, the previous control signal is maintained without variation and the delay amount of the delay MOS transistor is determined (S430). The delay MOS transistor may be a delay element MN1 or MP1 in one embodiment or another embodiment.

Figure 14:
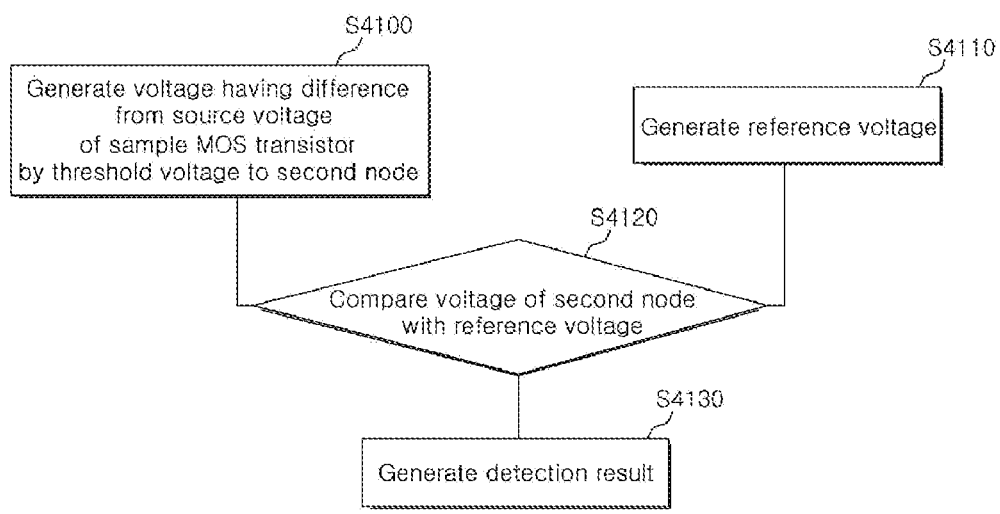
FIG. 14 is a detailed operational flowchart illustrating the step of detecting a voltage differing from a source voltage of a sample MOS transistor by a threshold voltage.

FIG. 14 is a detailed operational flowchart illustrating the step of detecting a voltage that differs from the source voltage of the sample MOS transistor by an amount equal to a threshold voltage.

The flowchart may include the steps of: generating a voltage that differs from the source voltage of the sample MOS transistor by an amount equal to a threshold voltage to the second node 350 (S4100); generating a reference voltage (S4110); comparing the voltage of the second node 350 with the reference voltage (S4120); and generating the result of the detection (S4130).

In the step S410 of generating a voltage that differs from the source voltage of the sample MOS transistor by a threshold voltage, when the sample MOS transistor is a PMOS transistor, the voltage that is lower than the predetermined power supply voltage by the threshold voltage is generated to the second node 350. When the sample MOS transistor is a NMOS transistor, a voltage that is higher than the predetermined power supply voltage by an amount equal to the threshold voltage is generated to the second node 350. The sample MOS transistor may be the transistor SP1 or SN1 of the comparison voltage generation block in one embodiment or another embodiment, and the second node 350 may be a node at which the comparison voltage generation block and the comparison block are electrically connected together.

Moreover, in the step S4110, the reference voltage may be generated using a resistance ratio by the reference voltage generation block in one embodiment or another embodiment.

Step S4120 compares the voltage generated in the second node 350 with the generated reference voltage. This comparison may be performed in the comparison block using a differential amplification.

Step S4130 compares the voltage of the second node 350 and the reference voltage and outputs the result of that comparison, and may be a step in which the comparison block in one embodiment or another embodiment applies the control signal to the adjustment block.

The above-described semiconductor integrated circuit may be used in a circuit which adjusts the signal delay amount, or may be used in a circuit which controls the access time (tAC) and the data retention time (tOH). When the signal transfer rate is varied because some process conditions are varied or an unintended property variation occurs due to process variables, the variation of the signal transfer rate is automatically detected and a control signal is generated. In this way, the conditions of the access time (tAC) and the data retention time (tOH) may be met.

Figure 15:
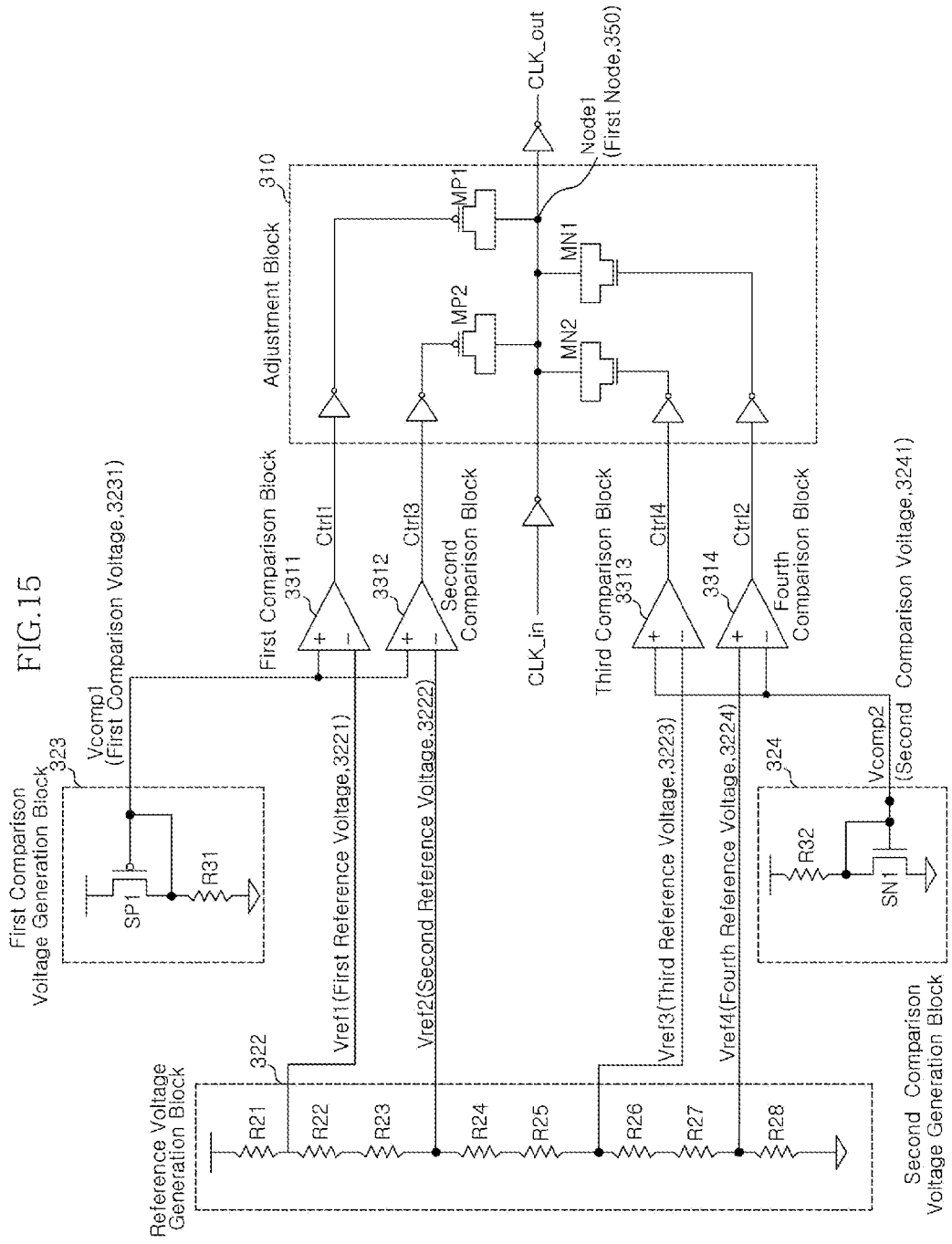
FIG. 15 is a circuit diagram of a semiconductor integrated circuit according to another embodiment.

FIG. 15 is a circuit diagram of a semiconductor integrated circuit according to another embodiment.

The semiconductor integrated circuit may include an adjustment block 310, a first comparison block 3311, a second comparison block 3312, a third comparison block 3313, a fourth comparison block 3314, a fourth comparison block 3314, a first comparison voltage generation block 323, a second comparison voltage block 324, a reference voltage generation block 322. The adjustment block 310 includes a first node 350 through which a signal is transferred from a clock input terminal CLK_IN to a clock output CLK_OUT, and two PMOS transistors MP1, MP2 and two NMOS transistors MN1, MN2 electrically connected to the first node 350. The first comparison block 3311 is configured to compare a first comparison voltage 3231 with a first reference voltage 3221, to amplify a comparison result signal, and to apply an amplified comparison result signal to the PMOS transistor MP1. The second comparison block 3312 is configured to compare a first comparison voltage 3231 with a second reference voltage 3222, to amplify a comparison result signal, and to apply an amplified comparison result signal to the PMOS transistor MP2. The third comparison block 3313 is configured to compare a second comparison voltage 3241 with a third reference voltage 3223, to amplify a comparison result signal, and to apply an amplified comparison result signal to the PMOS transistor MN2. The fourth comparison block 3314 is configured to compare a second comparison voltage 3241 with a fourth reference voltage 3224, to amplify a comparison result signal, and to apply an amplified comparison result signal to the PMOS transistor MN1. The first comparison voltage generation block 323 is configured to generate the first comparison voltage 3231. The second comparison voltage generation block 324 is configured to generate the second comparison voltage 3241. The reference voltage block 322 is configured to generate the first reference voltage 3221, the second reference voltage 3222, the third reference voltage 3223 and the fourth reference voltage 3224.

The first comparison voltage generation block 323 generates a voltage that is lower than a predetermined power supply voltage by an amount equal to the threshold voltage of a PMOS transistor SP1, and applies the voltage to the first comparison block 3311 and the second comparison block 3312 as the first comparison voltage 3231. The reference voltage generation block 322 generates the first reference voltage 3221 by using a resistance ratio a resistor R21 to Resistor R22, R23, R24, R25, R26, R27 and R28, and applies the first reference voltage 3221 to the first comparison block 3311. The reference voltage generation block 322 generates the second reference voltage 3222 by using a resistance ratio a resistor R21, R22, R23 to Resistor R24, R25, R26, R27 and R28, and applies the second reference voltage 3222 to the second comparison block 3312.

The second comparison voltage generation block 324 generates a threshold voltage of an NMOS transistor SN1, and applies the threshold voltage to the third comparison block 3313 and the fourth comparison block 3314. The reference voltage generation block 322 generates the third reference voltage 3223 by using a resistance ratio a resistor R21, R22, R23, R24 and R25 to the resistor R26, R27 and R28, and applies the third reference voltage 3223 to the third comparison block 3313. The reference voltage generation block 322 generates the fourth reference voltage 3224 by using a resistance ratio a resistor R21, R22, R23, R24, R25, R26 and R27 to the resistor R28, and applies the fourth reference voltage 3224 to the fourth comparison block 3314.

The first comparison block 3311 may include a differential amplifier which compares the first reference voltage 3221 with the first comparison voltage 3231 and generates the first control signal 340. The second comparison block 3312 may include a differential amplifier which compares the second reference voltage 3222 with the first comparison voltage 3231 and generates the third control signal 340. The third comparison block 3313 may include a differential amplifier which compares the third reference voltage 3223 with the second comparison voltage 3241 and generates the fourth control signal 340. The fourth comparison block 3314 may include a differential amplifier which compares the fourth reference voltage 3224 with the second comparison voltage 3241 and generates the second control signal 340. The PMOS transistors MP1, MP2 and the NMOS transistors MN1, MN2 of the adjustment block 310 are activated or deactivated in respond to the first and second control signals 340, respectively. When the PMOS transistors MP1, MP2 or the NMOS transistors MN1, MN2 is activated, it operates as a capacitor and reduces the signal transfer rate of the first node 350. When the PMOS transistors MP1, MP2 or the NMOS transistors MN1, MN2 is deactivated, it does not operate as a capacitor and thus has no influence on the signal transfer rate of the first node 350.

As described above, by controlling the PMOS transistors MP1, MP2 and the NMOS transistors MN1, MN2, variations in the signal transfer rate caused by property variations of the PMOS transistor and the NMOS transistor may be resolved. Meanwhile, by adding capacitors that are electrically connected to the first node 350 and operate as capacitors in the above-described manner, it is possible to precisely control the signal transfer rate in each step.

While certain embodiments have been described above, those skilled in the art will understand that such embodiments are examples only. Accordingly, the semiconductor integrated circuit and the method for determining the delay amount using the same described herein should not be limited based on the described embodiments. Rather, the semiconductor integrated circuit and the method for determining the delay amount using the same described herein should only be limited in light of the claims that follow when taken in conjunction with the above description and accompanying drawings.

What is claimed is:

1. A semiconductor integrated circuit comprising:
a first node through which an input signal passes;
an adjustment block comprising delay units electrically connected to the first node; and
a correction block configured to generate a first control signal and a second control signal which controls whether to selectively activate the delay units, wherein the correction block comprises:
a voltage generation unit configured to generate a first reference voltage, a second reference voltage, a first comparison voltage and a second comparison voltage; and
a comparison unit configured to generate the first control signal by comparing the first reference voltage and the first comparison voltage, and generate the second control signal by comparing the second reference voltage and the second comparison voltage,
wherein the first and second comparison voltages are generated by using threshold voltages of different types of MOS transistors.

2. The semiconductor integrated circuit according to claim 1, wherein the voltage generation unit comprises:
a reference voltage generation section configured to generate the first and second reference voltages; and
a comparison voltage generation section configured to generate the first and second comparison voltages.

3. The semiconductor integrated circuit according to claim 2, wherein the comparison voltage generation section comprises one or more MOS transistors and generates the first and second comparison voltages by using a threshold voltage of the MOS transistors.

4. The semiconductor integrated circuit according to claim 3, wherein the delay units comprise a first delay element, and the first delay element and the MOS transistors of the comparison voltage generation section are the same type of MOS transistors.

5. The semiconductor integrated circuit according to claim 3, wherein the delay units comprise a first delay element and a second delay element,
the MOS transistors comprise a first MOS transistor and a second MOS transistor,
the first MOS transistor and the first delay element are NMOS transistors, and the second MOS transistor and the second delay element are PMOS transistors.

6. The semiconductor integrated circuit according to claim 5, the comparison unit comprises:
 a first comparison section configured to compare the first reference voltage and the second comparison voltage, and to generate the first control signal; and
 a second comparison section configured to compare the second reference voltage and the second comparison voltage, and to generate the second control signal; and
the first delay element operates in response to the first control signal, and the second delay element operates in response to the second control signal.

* * * * *